United States Patent
Marasch et al.

(10) Patent No.: US 9,148,171 B1
(45) Date of Patent: Sep. 29, 2015

(54) PARALLEL INTERFACE PATTERN MODIFICATION FOR ADDRESSING SIGNAL INTEGRITY CONCERNS

(71) Applicant: LSI Corporation, San Jose, CA (US)

(72) Inventors: Marek J. Marasch, Longmont, CO (US); Jeffrey S. Brown, Fort Colllins, CO (US); Jay Daugherty, Longmont, CO (US); Jay D. Harker, Denver, CO (US)

(73) Assignee: Avago Technologies General IP (Singapore) PTE. LTD., Singapore (SG)

( * ) Notice: Subject to any disclaimer, the term of this patent is extended or adjusted under 35 U.S.C. 154(b) by 0 days.

(21) Appl. No.: 14/445,885

(22) Filed: Jul. 29, 2014

(51) Int. Cl.
H03M 7/34 (2006.01)
H03M 7/30 (2006.01)
H03M 5/14 (2006.01)
H03K 19/003 (2006.01)
G06F 11/24 (2006.01)

(52) U.S. Cl.
CPC ............ H03M 7/3059 (2013.01); G06F 11/24 (2013.01); H03K 19/00346 (2013.01); H03M 5/145 (2013.01)

(58) Field of Classification Search
CPC ......... H03M 5/06; H03M 5/145; H03M 7/02; H03M 7/20; H03M 7/46; H03M 7/3059; H03K 19/00346; H04L 25/14; H04L 25/4908; H04L 27/04; H04L 25/0274; H04L 25/4915; G11C 7/02; G11C 7/1006; G06F 13/14; G06F 13/16; G06F 13/20; G06F 13/38; G06F 13/4072; G06F 13/4204; G06F 13/4265; G06F 13/4234; G06F 11/24; G06F 11/1032; G01R 31/3191; G01R 31/3177; G01R 31/318519; G01R 31/318533
USPC ............ 341/51, 55, 58, 63, 94; 375/219, 257, 375/258, 259, 264, 286; 370/445, 329, 334; 714/724, E11.047, E11.154
See application file for complete search history.

(56) References Cited

U.S. PATENT DOCUMENTS

| | | | |
|---|---|---|---|
| 5,481,555 A * | 1/1996 | Wade et al. | 714/812 |
| 6,624,764 B2 * | 9/2003 | Wei | 341/59 |
| 6,734,811 B1 * | 5/2004 | Cornelius | 341/58 |
| 6,965,648 B1 * | 11/2005 | Smith et al. | 375/257 |
| 7,084,530 B2 | 8/2006 | Chuang | |
| 7,102,544 B1 * | 9/2006 | Liu | 341/51 |
| 7,259,702 B2 * | 8/2007 | Rai et al. | 341/100 |
| 8,260,992 B2 * | 9/2012 | Dearth et al. | 710/117 |
| 8,510,490 B2 * | 8/2013 | Abbasfar | 710/105 |
| 8,581,755 B2 * | 11/2013 | Abbasfar et al. | 341/58 |
| 8,593,305 B1 * | 11/2013 | Tajalli et al. | 341/58 |
| 8,649,445 B2 * | 2/2014 | Cronie et al. | 375/259 |
| 2014/0044157 A1 * | 2/2014 | Chang et al. | 375/219 |

* cited by examiner

*Primary Examiner* — Lam T Mai
(74) *Attorney, Agent, or Firm* — Hamilton DeSanctis & Cha

(57) ABSTRACT

A method for enhancing signal integrity in an interface between a source device and at least one destination device includes: analyzing two or more consecutive data patterns intended to be conveyed by the interface to determine whether data transitions corresponding to the data patterns are likely to introduce coupling noise and/or simultaneous switching output (SSO) effects on the interface; generating a modified data pattern for transmission by the interface, the modified data pattern reducing coupling noise and/or SSO effects on the interface compared to an original data pattern intended to be conveyed by the interface; and transmitting the modified data pattern and information regarding a manner in which the original data pattern was modified to the destination device to thereby reduce coupling noise and/or SSO effects on the interface.

21 Claims, 12 Drawing Sheets

US 9,148,171 B1

PARALLEL INTERFACE PATTERN MODIFICATION FOR ADDRESSING SIGNAL INTEGRITY CONCERNS

FIELD OF INVENTION

The present invention relates generally to electrical and electronic circuitry, and more particularly relates to signal interfacing.

BACKGROUND

Electronic interfaces are used ubiquitously to transfer information, generally in the form of analog and digital signals, between two or more functional blocks. Two common interface architectures are serial interfaces and parallel interfaces. In a digital application, a parallel interface generally refers to a multiline channel, each line capable of transmitting several bits of data simultaneously. Most commonly, personal computers have traditionally incorporated at least one parallel interface employing a parallel communications port (e.g., IEEE 1294, or similar). In contrast, a serial interface generally refers to a single channel capable of only transmitting one bit of data at a time.

The capabilities of a parallel interface, although having a higher bandwidth for transmission of signals, are often limited by signal integrity (SI) effects. Two factors which contribute to SI effects include, but are not limited to, coupling of signals (e.g., crosstalk), and simultaneous switching output (SSO) effects on power. Coupling of signals is generally an electromagnetic phenomenon (e.g., relating to spurious signals or signal components induced on a signal line by electromagnetic field interactions from another signal line). SSO noise, also known as ground bounce or power bounce, is typically a result of large instantaneous changes in current across the power/ground inductance of an integrated circuit. This potential problem becomes more serious as the number of active high-drive (e.g., low-voltage complementary metal-oxide-semiconductor (LVCMOS)) outputs on an integrated circuit device increases. In large field programmable gate arrays (FPGAs), for example, with several synchronous parallel interfaces this phenomenon can result in poor system performance and/or intermittent data errors.

SUMMARY

In accordance with an embodiment of the invention, a method for enhancing signal integrity in an interface between a source device and at least one destination device includes: analyzing two or more consecutive data patterns intended to be conveyed by the interface to determine whether data transitions corresponding to the data patterns are likely to introduce coupling noise and/or simultaneous switching output (SSO) effects on the interface; generating a modified data pattern for transmission by the interface, the modified data pattern reducing coupling noise and/or SSO effects on the interface compared to an original data pattern intended to be conveyed by the interface; and transmitting the modified data pattern and information regarding a manner in which the original data pattern was modified to the destination device to thereby reduce coupling noise and/or SSO effects on the interface. Other embodiments of the invention include, but are not limited to, being manifest as an interface apparatus, an integrated circuit including at least one interface circuit, and an electronic system. Additional and/or other embodiments of the invention are described in the following written description, including the claims, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
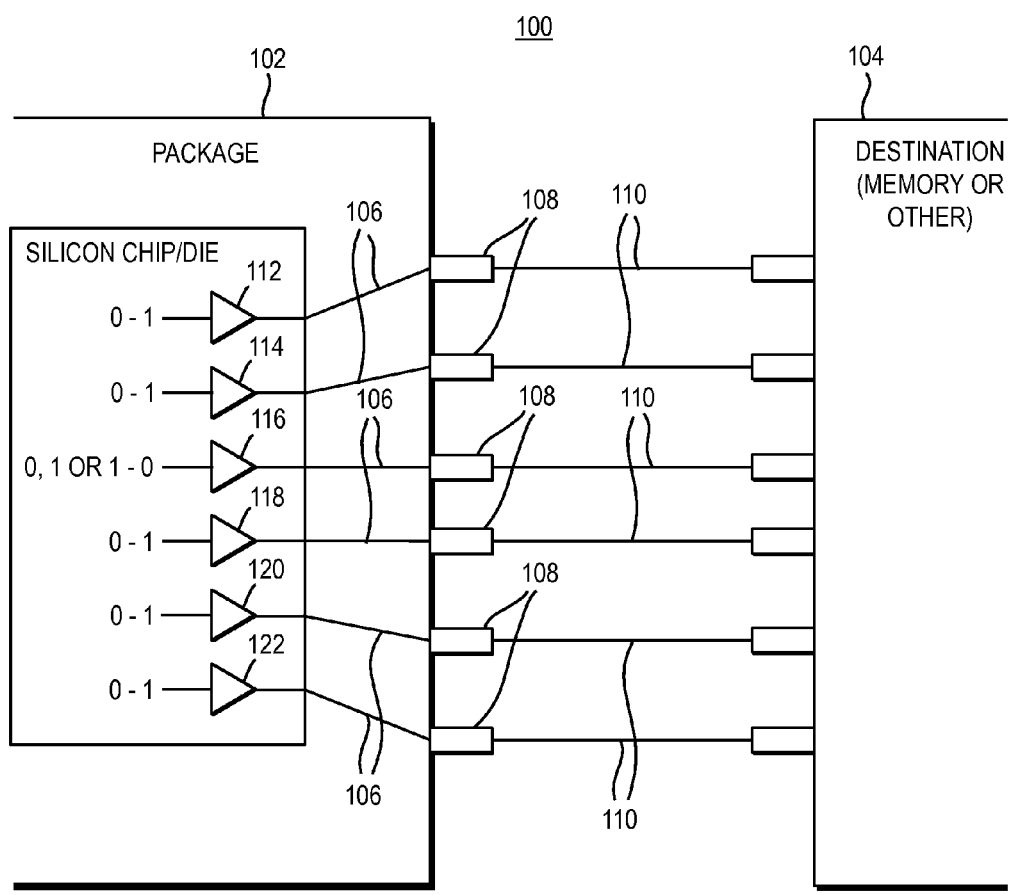
FIG. 1 is a block diagram depicting at least a portion of an exemplary bus interface system for demonstrating simultaneous switching output (SSO) effects according to a first illustrative signal switching scenario.

It is to be appreciated that the drawings described herein are presented for illustrative purposes only. Moreover, common but well-understood elements and/or features that may be useful or necessary in a commercially feasible embodiment may not be shown in order to facilitate a less hindered view of the illustrated embodiments.

WRITTEN DESCRIPTION

Embodiments of the invention will be described herein in the context of illustrative parallel interface circuitry for use, for example, in a data communication system. It should be understood, however, that embodiments of the invention are not limited to these or any other particular interface arrangements or applications. Rather, embodiments of the invention are more broadly applicable to techniques for improving signal integrity in an interface circuit. In this regard, embodiments of the invention provide an apparatus and methodology for beneficially mitigating the impact of simultaneous switching output (SSO) effects and/or other coupling noise (e.g., crosstalk) in an interface. More particularly, one or more embodiments of the invention utilize an encoding and/or decoding scheme in which transmitted and/or received data patterns, respectively, are modified in such a way as to reduce SSO effects and/or other coupling noise in an interface between a source device and at least one destination device to thereby improve signal integrity.

It will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

| Table of Acronym Definitions | |
| --- | --- |
| Acronym | Definition |
| SI | Signal integrity |
| SSO | Simultaneous switching output |
| SoC | System on a chip |
| ASIC | Application-specific integrated circuit |
| PCB | Printed circuit board |
| IO | Input/output |
| CPU | Central processing unit |
| RAM | Random access memory |
| ROM | Read-only memory |
| EPROM | Erasable programmable read-only memory |
| CD-ROM | Compact disk read-only memory |
| LAN | Local area network |
| WAN | Wide area network |
| HDD | Hard disk drive |
| SSD | Solid-state drive or solid-state disk |
| RAID | Redundant array of independent devices |

SSO noise, as the name implies, is the result of simultaneous internal and external circuitry switching. The cumulative effect of switching current passing through power and ground inductance is device-generated noise, which is undesirable. This SSO noise is evident on both static and dynamic (i.e., switching) outputs, as it causes power and/or ground noise that impacts the behavior of certain circuits and circuit components (e.g., output buffers in an interface application). SSO effects often occur when a power network is not able to maintain a constant voltage with the sudden surge of power required during signal transitions. SSO effects are an inductance phenomenon in the power network, whereas coupling noise generally refers to signal-to-signal or signal-to-power/ground interactions caused primarily by an electromagnetic field generated by one signal interfering with the voltage or current on another signal, power and/or ground node.

FIG. 1 is a block diagram depicting at least a portion of an exemplary bus interface system 100 for conceptually demonstrating SSO and/or coupling noise effects, according to a first illustrative signal switching scenario. The bus interface system 100 includes a source device 102 (e.g., a system on a chip (SoC), application-specific integrated circuit (ASIC), etc.) and a destination device 104 (e.g., memory) coupled with the source device via a connection structure. The connection structure may comprise, for example, bond wires 106 between pads on a chip or die and a package lead frame, input/output (IO) package pins or balls 108, printed circuit board (PCB) traces 110, or alternative connection elements.

The source device 102 includes a plurality of IO buffers or drivers, each buffer having an output coupled with a corresponding pin 108 of the packaged device. Specifically, the source device 102 includes a first buffer 112, a second buffer 114, a third buffer 116, a fourth buffer 118, a fifth buffer 120, and a sixth buffer 122. It is to be understood that embodiments of the invention are not limited to any specific number of buffers. Signals generated by the source device 102 are driven out through the IO buffers 112, 114, 116, 118, 120, 122 and transmitted to the destination device 104 through the connection structure. Collectively, outputs of the IO buffers, in one or more embodiments, form a bus (e.g., address bus, data bus, etc.).

The system 100, which focuses primarily on the coupling of signals between the source device 102 and the destination device 104, shows exemplary transitions on the bus formed by the outputs of the IO buffers 112, 114, 116, 118, 120, 122. For example, buffers 112, 114, 118, 120 and 122 are shown transitioning from a logic low ("0") state to a logic high ("1") state (represented as "0-1"). Buffer 116, however, is switching differently than its two immediately adjacent buffers 114 and 118; namely, buffer 116 is shown as being at a static low logic state ("0"), a static high logic state ("1"), or transitioning from a logic high state to a logic low state ("1-0"). The signal generated by buffer 116 is designated as a victim signal, and the signals generated by the other buffers 112, 114, 118, 120, 122 that are switching the same relative to one another (and differently than the victim signal) are designated as aggressor signals. Although this scenario is merely illustrative, and embodiments of the invention are not limited to any specific signal levels or transitions of the IO buffers, the idea is that there is at least one signal that can be identified as being at risk of being a victim; in this case, having several adjacent buffers 112, 114, 118, 120, 122 switching independently of buffer 116. The signals generated by the other buffers 112, 114, 118, 120, 122, would not be at high risk in the victim role, as the majority of their neighbors are switching in the same manner. Although no static signals are shown in FIG. 1, static signals will generally decrease the noise injected onto a signal. It is to be appreciated that the victim/aggressor designation may change depending on the levels of signals being conveyed in the system at any given time. The victim signals may be coupled with the same load, such as, for example, the destination device 104 in the example, or they could be coupled elsewhere on the PCB, such as, for example, with power or ground.

Figure 2:
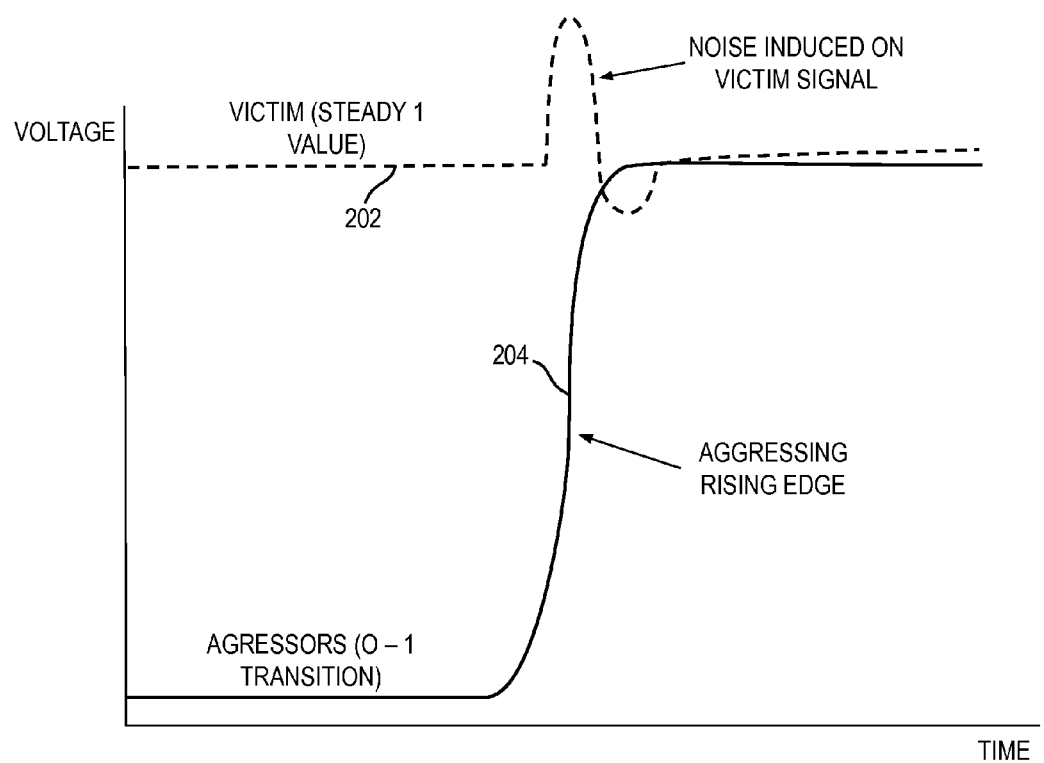
FIG. 2 is a graph depicting exemplary signals associated with the source device in the illustrative system shown in FIG. 1 over a prescribed period of time.

FIG. 2 is a graph depicting exemplary signals associated with the source device 102 in the illustrative system 100 shown in FIG. 1 over a prescribed interval of time. With reference to FIG. 2, waveform 202 represents a victim signal, which in the illustrative scenario shown in FIG. 1 is an output signal from buffer 116, and waveform 204 represents an aggressor signal, which in FIG. 1 is an output signal from an adjacent buffer (e.g., buffer 114 or 118). In this example, the victim signal 202 generated by buffer 116 that is at a static logic high level, and the aggressor signal 204 generated by buffer 114 or 118 transitions from a logic low level to a logic high level. When the aggressor signal 204 transitions from low to high, SSO noise is induced on the victim signal 202, causing the signal voltage level to spike momentarily above its quiescent static high level. The position, polarity, shape, or other characteristics of the noise injected onto the victim signal can change from system to system, depending on various factors associated with the system (e.g., impedance, etc.). This spike can cause invalid switching, reliability problems, or other undesirable issues.

Figure 3:
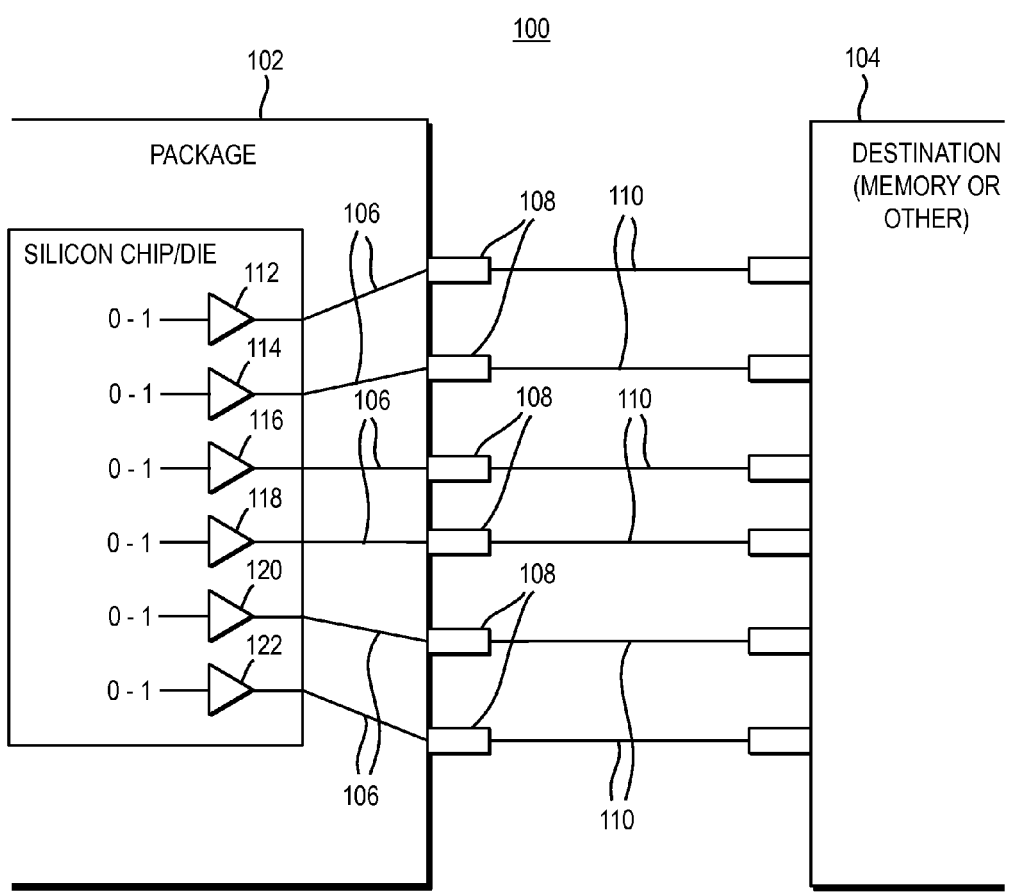
FIG. 3 is a block diagram depicting at least a portion of an exemplary bus interface system for demonstrating SSO effects according to a second illustrative signal switching scenario.

In some situations, SSO noise is introduced on an internal node or connection of a circuit, such as power and/or ground connections. Consider, for example, the system 100 when all IO buffers 112 through 122 in the source device 102 transition from a logic low state to a logic high state ("0-1") at substantially the same time, as shown in FIG. 3. In this illustrative scenario, there is essentially no designated victim, since all buffers are transitioning in the same manner. The effect on the power and ground lines for this exemplary extreme case is shown conceptually in FIG. 4.

Figure 4:
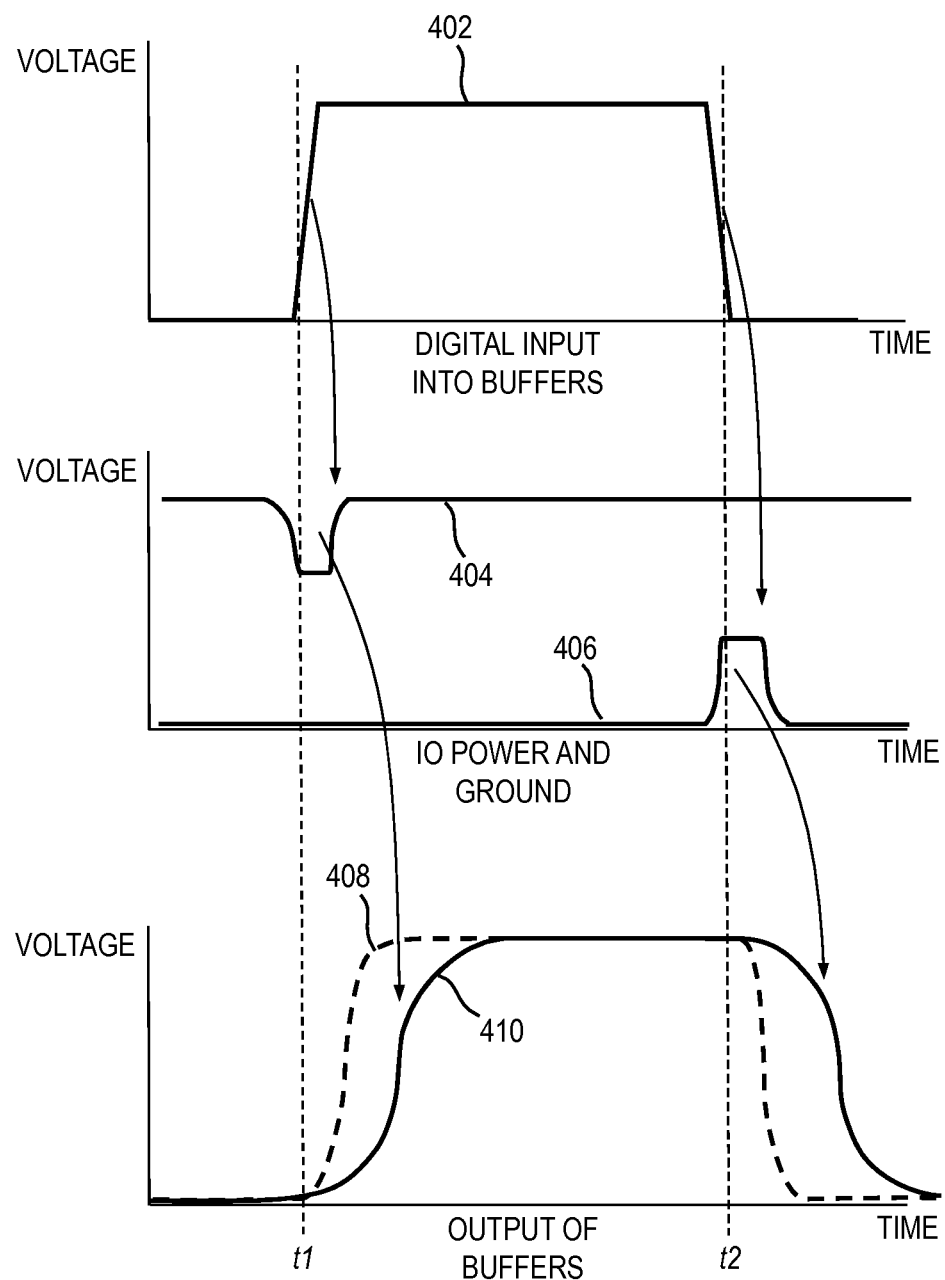
FIG. 4 is a graph depicting exemplary signals associated with the source device in the illustrative system shown in FIG. 3 over a prescribed period of time and the effects of SSO on these signals.

More particularly, FIG. 4 is a graph depicting exemplary signals associated with the source device 102 in the illustrative system 100 shown in FIG. 3 over a prescribed interval of time and the effects of SSO noise on these signals. With reference to FIG. 4, waveform 402 is representative of a digital input signal to each of the IO buffers 112, 114, 116, 118, 120, 122 in the exemplary scenario of FIG. 3. Time t1 is indicative of a rising edge of the buffer input signal and time t2 is indicative of a falling edge of the buffer input signal.

Waveforms 404 and 406 show an example of the power and ground effects, respectively, caused by SSO noise. Specifically, at time t1, coincident with the rising edge of the input signal to the buffers, waveform 404 exhibits a momentary "droop" in a voltage level of the power supply as it struggles to source sufficient current for the near simultaneous transition of all the buffers (112 through 122 in FIG. 3) from low to high logic states. Likewise, at time t2, coincident with the falling edge of the input signal to the buffers, waveform 406 exhibits a momentary "bounce" in a voltage level of the ground return as it struggles to sink sufficient current for the transition of all the buffers from high to low logic states. This SSO noise on the power and ground connections to the buffers, as evidenced by waveforms 404 and 406, respectively, results in delaying the buffer output signals and slowing the transitions between logical states (i.e., 0-1, and 1-0), often referred to as "SSO push-out." Waveform 408 represents an ideal buffer output signal without SSO effects, and waveform 410 represents an actual buffer output signal which is delayed from the ideal output signal and exhibits slower rise and fall times relative to the ideal buffer output signal. The slower rise and fall times are due primarily to a substantial increase in power consumption in the system.

Figure 5:
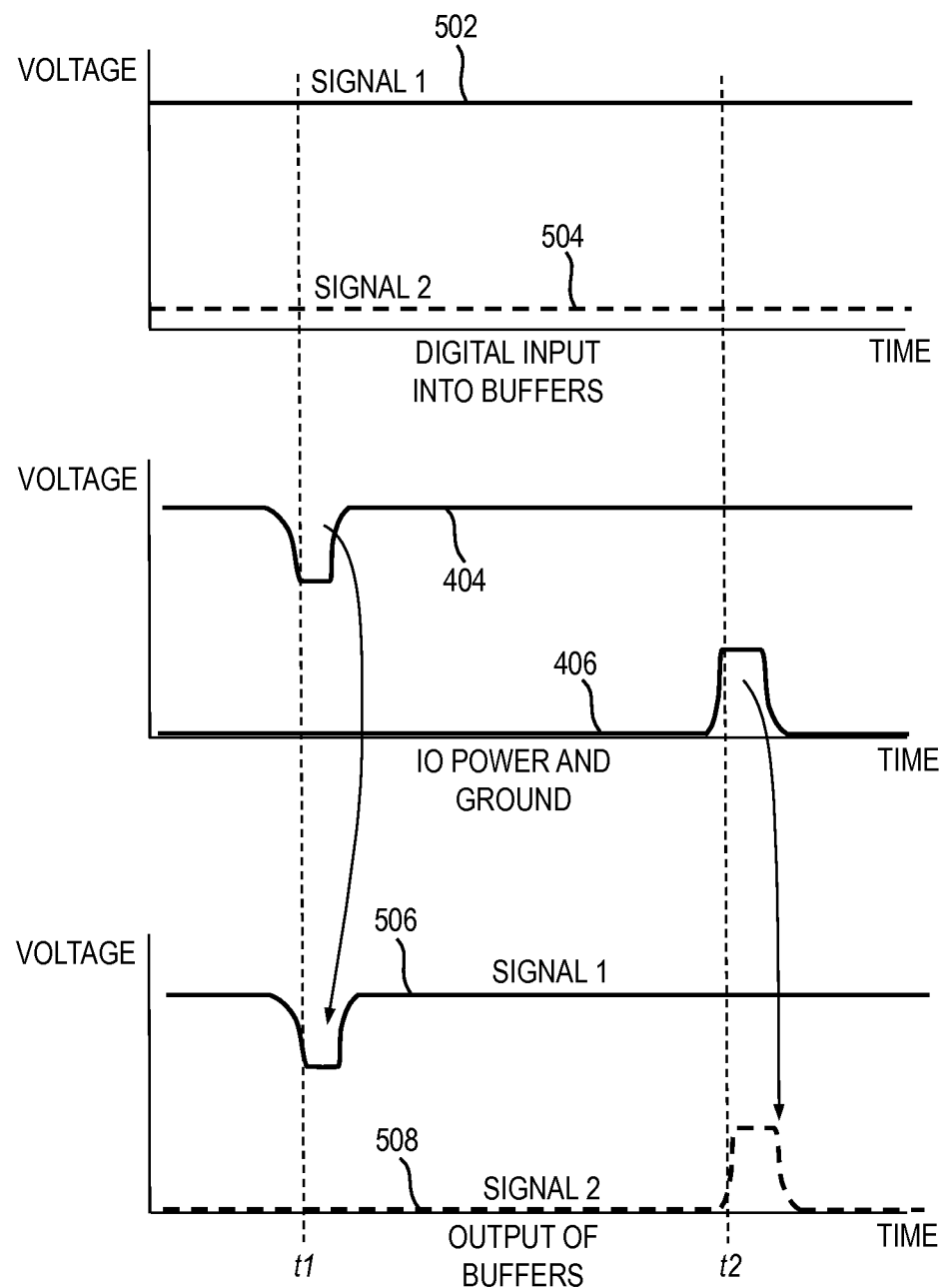
FIG. 5 is a graph depicting the effects of SSO noise on certain static signals associated with the source device in the illustrative system shown in FIG. 3 over a prescribed interval of time.

FIG. 5 is a graph depicting the effects of SSO noise on certain static signals associated with the source device 102 in the illustrative system 100 shown in FIG. 3 over a prescribed interval of time. Specifically, waveform 502 is representative of a first input signal, Signal 1, to a given one of the IO buffers (e.g., buffer 116 in FIG. 1) which is at a static logic high level, and waveform 504 is representative of a second input signal, Signal 2, to a given one of the IO buffers which is at a static logic low level. As apparent from FIG. 5, at time t1, coincident with the rising edge of a digital input signal to one or more of the buffers (e.g., waveform 402 in FIG. 4), waveform 504 exhibits a momentary "droop" in voltage level of the power supply as it struggles to source sufficient current for the near simultaneous transition of the buffers from low to high logic states, as previously stated. Likewise, at time t2, coincident with the falling edge of the input signal to the buffers, waveform 406 exhibits a momentary "bounce" in a voltage level of the ground return as it struggles to sink sufficient current for the transition of all the buffers from high to low logic states. The specific behavior of the power and/or ground signals may vary depending on certain system characteristics, such as, for example, capacitance in the system (parasitic or otherwise), impedance/load, etc.

This SSO noise on the power and ground connections to the buffers, as evidenced by waveforms 404 and 406, respectively, is transferred to output signals generated by the IO buffers receiving the static input signals. More particularly, waveform 506, which represents an output signal generated by the IO buffer receiving waveform 502 as its input signal, will exhibit a momentary "droop" in voltage level coincident with the droop in voltage level of the power line at time t1 evidenced in waveform 404. Likewise, waveform 508, which represents an output signal generated by the IO buffer receiving waveform 504 as its input signal, exhibits a momentary "bounce" in a voltage level coincident with the bounce in voltage level of the ground line at time t2 evidenced in waveform 406.

Figure 6:
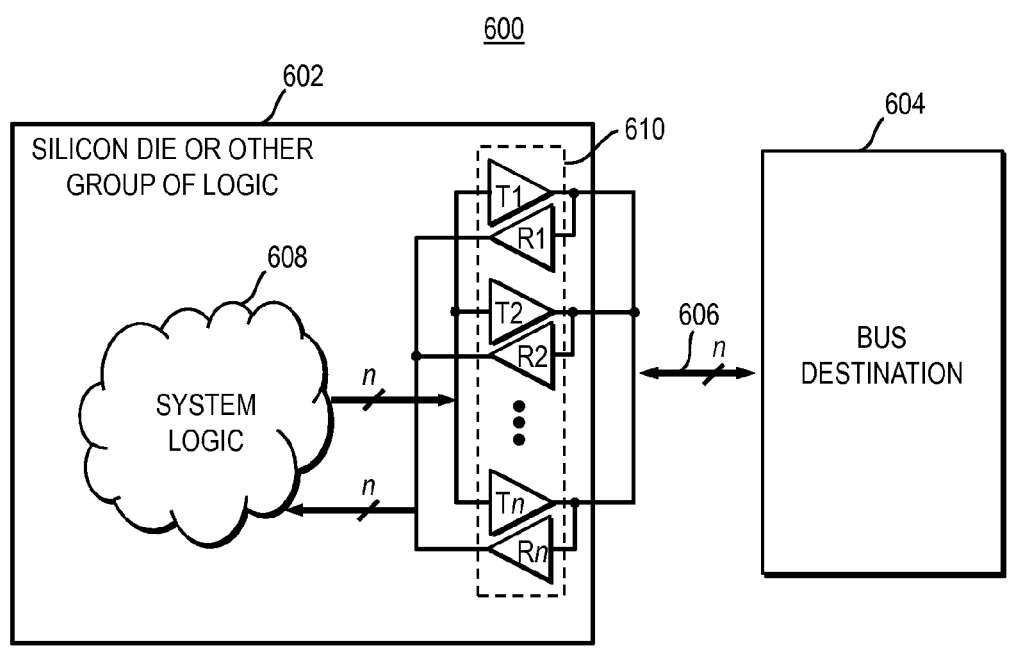
FIG. 6 is a schematic diagram depicting at least a portion of an exemplary interface system for transferring data between two or more system component devices, which can be useful in implementing one or more embodiments of the invention.

FIG. 6 is a block diagram depicting at least a portion of an exemplary interface system 600 for transferring data between two or more system component devices, which can be modified to implement one or more embodiments of the invention. The interface system 600 includes a first device 602, which may comprise a silicon die or other group of logic (e.g., an SoC, ASIC, etc.) and a second device 604, which may be a bus destination device (e.g., memory, etc.) coupled with the first device via a connection 606 (e.g., bus). As previously stated in conjunction with FIG. 1, the connection 606 may comprise, for example, bond wires, IO package pins/balls, PCB traces, and/or alternative connection elements.

The first device 602 includes system logic 608, represented conceptually as a "cloud" of logic since the specific logic circuitry employed is not necessarily critical to embodiments of the invention, and interface circuitry 610 coupled with the system logic. The interface circuitry 610, in this embodiment, includes a plurality of bidirectional buffers, shown as transmit (i.e., output) buffers, T1, T2, through Tn, where n is an integer, and corresponding receive (i.e., input) buffers, R1, R2 through Rn. The number n of transmit and receive buffers defines a width of an output bus and input bus, respectively, forming the connection 606 between the first and second devices 602, 604. It is to be appreciated that embodiments of the invention are not limited to any specific number of buffers in the interface circuitry 610, and thus is not limited to any particular bus width.

Conventionally, data is passed unmodified from the first device 602 to the corresponding bus destination device 604. Thus, in an illustrative parallel bus implementation in which system logic drives bidirectional buffers conveying data to a destination part, such as, for example, as a buffer in a hard drive, if 0xAB is being written to the hard drive and needs to be buffered, the data will be sent to the memory as 0xAB. However, this arrangement can cause SSO effects and other coupling noise, as previously described and shown in conjunction with FIGS. 2, 4 and 5. Hence, in order to improve signal integrity, among other benefits, embodiments of the invention advantageously modifies the data pattern transmitted and/or received by the first device 602 so as to reduce SSO effects and other coupling noise, as will be described in further detail below.

Figure 7:
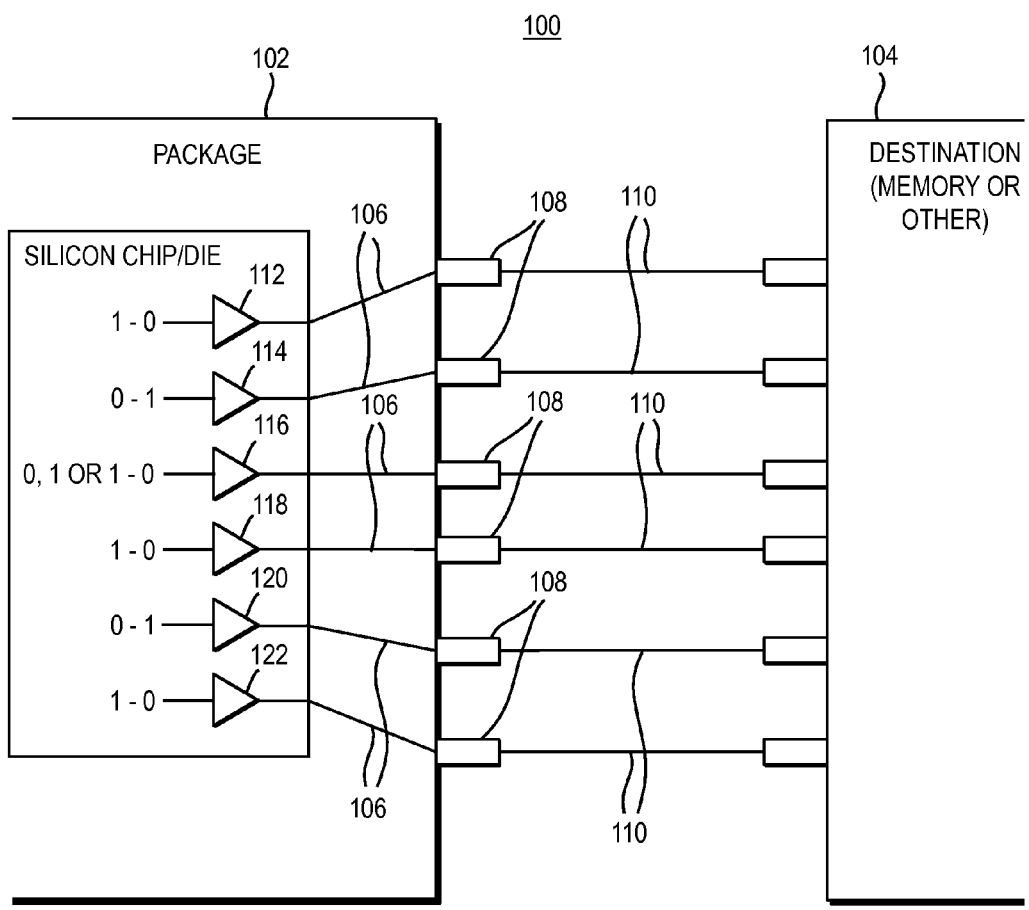
FIG. 7 is a block diagram depicting at least a portion of an exemplary bus interface system in which input/output (IO) buffers are configured having balanced transitions to reduce coupled noise, according to an embodiment of the invention.

With reference now to FIG. 7, at least a portion of an exemplary bus interface system 100 is depicted with IO buffers 112 through 122 configured having balanced transitions to reduce coupled noise (e.g., SSO), according to an embodiment of the invention. As apparent from FIG. 7, the data transitions have been modified, in accordance with one or more embodiments, such that buffer 112 transitions from a logic high state to a logic low state (1-0), adjacent buffer 114 transitions from a logic low state to a logic high state (0-1), buffer 116 is at a static low state, a static high state, or transitions from a logic high state to a logic low state, buffer 118 transitions from a logic high state to a logic low state, adjacent buffer 120 transitions from a logic low state to a logic high state, and buffer 122 transitions from a logic high state to a logic low state. Configured as such, adjacent buffers will not be transitioning in the same manner at any given time.

It is to be understood that embodiments of the invention are not limited to any particular data transitions. Additionally, while FIG. 7 depicts just one exemplary transition (illustrating, in essence, a snapshot of a data transition at a given moment in time), a practical implementation of the system 100 typically entails the transmission of multiple data patterns and corresponding data transitions. Consequently, reducing SSO and coupling noise, according to one or more embodiments, would involve an analysis of multiple bytes, or other groupings of signals, in order to achieve more optimal performance over a prescribed period of time. By way of example only and without limitation, a bus interface system according to one or more embodiments of the invention includes a monitor, comparator, or alternative detection means (not explicitly shown, but implied) configured to determine whether data transitions occurring on any two adjacent buffer outputs, if unmodified, would be the same during a prescribed interval of time.

Figure 8:
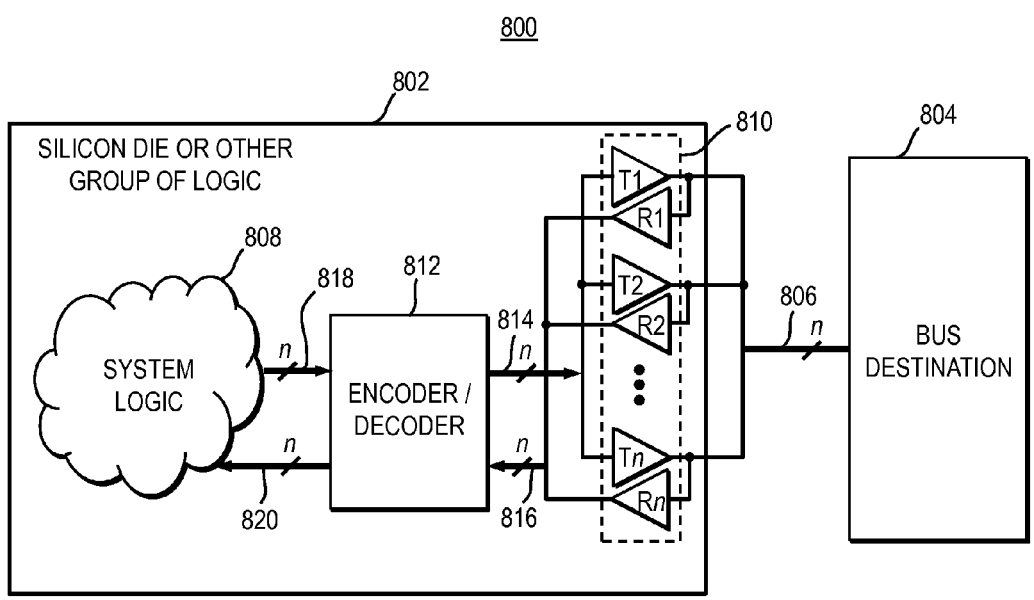
FIG. 8 is a block diagram depicting at least a portion of an exemplary bus interface system for transferring data between two or more system component devices, according to an embodiment of the invention.

FIG. 8 is a block diagram depicting at least a portion of an exemplary bus interface system 800 for transferring data between two or more system component devices, according to an embodiment of the invention. The interface system 800 includes a first device 802, which may comprise a silicon die or other arrangement of logic (e.g., an SoC, ASIC, etc.) and a second device 804, which may be a bus destination device (e.g., memory, hard disk drive, solid-state device, etc.) coupled with the first device via a connection bus 806. As previously stated in conjunction with FIG. 1, the connection bus 806 may comprise, for example, bond wires, IO package pins/balls, PCB traces, and/or alternative connection elements.

The first device 802 includes system logic 808, represented conceptually as a "cloud" of logic since the specific logic circuitry employed is not necessarily critical to embodiments of the invention, and interface circuitry 810 coupled with the system logic via an encoder/decoder 812. The interface circuitry 810, in this embodiment, includes a plurality of bidirectional buffers, shown as transmit buffers, T1, T2, through Tn, where n is an integer, and corresponding receive buffers, R1, R2 through Rn. The number n of transmit and receive buffers defines a width of an output bus and input bus, respectively, forming the connection bus 806 between the first and second devices 802, 804. It is to be appreciated that embodiments of the invention are not limited to any specific number of buffers in the interface circuitry 810.

Respective inputs of the transmit buffers T1 through Tn form a transmit bus 814 which is coupled with an output of an encoder portion of the encoder/decoder 812, and respective outputs of the receive buffers R1 through Rn form a receive bus 816 which is coupled with an input of a decoder portion of the encoder/decoder. The transmit bus 814 is employed by the first device 802 during a write (i.e., transmit) operation to the second device 804, and the receive bus 816 is employed by the first device during a read (i.e., receive) operation from the second device. An output of each transmit buffer is connected with an input of a corresponding receive buffer; collectively, the outputs of the transmit buffers and the inputs of the receive buffers form the connection bus 806. An input of the encoder portion of the encoder/decoder 812 is coupled with the system logic 808 via a data input bus 818, and an output of the decoder portion of the encoder/decoder is coupled with the system logic via a data output bus 820.

In accordance with one or more embodiments, data that the second device 804 receives from the first device 802 will not necessarily correspond with data output by the system logic 808 since the encoder/decoder 812 is configured to modify, as appropriate, the data pattern generated by the system logic before being supplied to the interface circuitry 810 such that SSO and other coupling noise is reduced.

Figure 9:
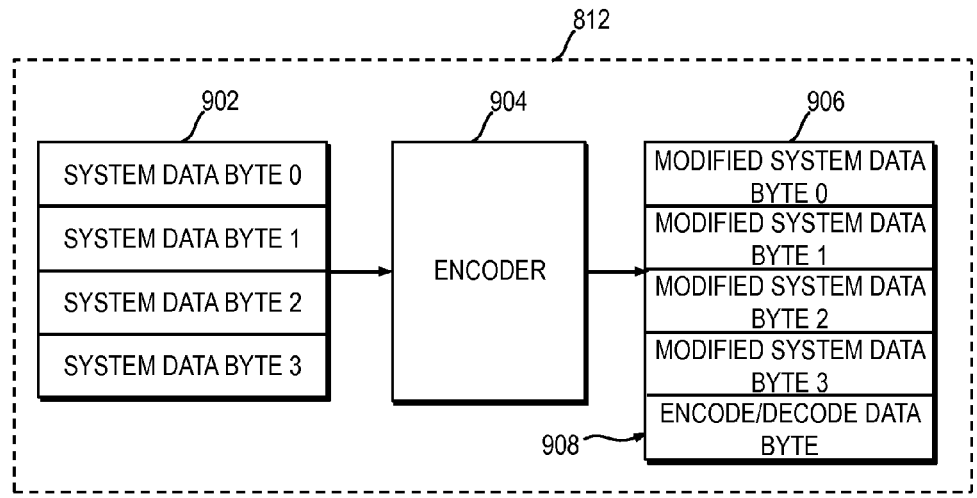
FIG. 9 is a block diagram depicting an exemplary data flow between system logic and interface circuitry shown in FIG. 8 during a write operation, according to an embodiment of the invention.

By way of example only and without limitation, FIG. 9 is a block diagram depicting an exemplary data flow between the system logic 808 and the interface circuitry 810 shown in FIG. 8 during a write operation to a destination device, according to an embodiment of the invention. With reference to FIG. 9, a portion of the encoder/decoder 812 used during the write operation is shown. Specifically, the encoder/decoder 812, in one or more embodiments, includes a first buffer 902 configured to at least temporarily store data (system data byte 0, system data byte 1, system data byte 2, system data byte 3) received from the system logic (808 in FIG. 8), an encoder 904 coupled with the first buffer and configured to analyze multiple bytes of data, or other groupings of information, stored in the first buffer and to determine an appropriate modification of the data so as to achieve reduced SSO and coupling noise, and a second buffer 906 coupled with the encoder and configured to at least temporarily store modified system data (modified system data byte 0, modified system data byte 1, modified system data byte 2, modified system data byte 3) corresponding to the data stored in the first buffer. The modified system data stored in the second buffer 906 is then written to the destination device (e.g., bus destination device 804 in FIG. 8).

In order to analyze the data transitions of the system logic (808 in FIG. 8), the encoder 904 is configured to compare a previous system data byte stored in the first buffer 902 with a present system data byte (temporally adjacent in time to the stored data byte; that is, a next subsequent data byte) to thereby determine which bit position(s) have changed logical state. Once this determination has been made and the encoder 904 has generated the modified data, the present system data byte will overwrite the previous system data byte in the first buffer 902, in accordance with one or more embodiments. This methodology minimizes the amount of storage space required by the first buffer 902.

The destination device does not necessarily need to have a priori knowledge that the data from the source device has been modified. However, in accordance with one or more embodiments, some additional information is sent with the system data so that the destination device can determine how to decode the modified data for storage. In one or more embodiments of the invention, in order for the destination device to determine how the data was modified by the source device, the encoder 904 generates additional information as a function of the encoding scheme employed. This additional information is then transmitted to the destination device, for example embedded with the modified system data. The additional information may be stored in the second buffer 906 as an added byte 908 (or bytes, or other unit(s)). Alternatively, the additional information can be stored in a separate storage element external to the second buffer, or even external to the encoder/decoder 812, or optionally transmitted to the destination device directly without being stored.

The additional information used to decode the modified system data during the write operation to the destination device can be arranged in various ways, depending on the methodology used to encode the data (i.e., based on the encoding algorithm), the desired system complexity and/or available overhead, among other factors. By way of example only and without limitation, the additional information used for decoding the modified system data may be transmitted in one or more of the following ways, according to embodiments of the invention:

- as an additional byte or bytes (or other unit(s)) of data, one or more of which comprise algorithm information to be used in decoding the modified data;
- as an additional byte or bytes (or other unit(s)) of data, with the algorithm information used for decoding the modified data interspersed among, or otherwise embedded with, other data bits on the bus;
- using a type of algorithm that compresses the data (i.e., a data compression algorithm) so that the additional bytes (or other units) of data used for decoding the modified data do not require added storage space;
- expanding the bus by including additional bits so that each cycle of modified data carries with it the information on how the data was modified (or if the system data was modified, since modification of the data may not be required, depending on the data pattern to be transmitted).

In the exemplary encoding methodology depicted in FIG. 9, four bytes of data from the system logic, temporarily stored in the first buffer 902, are provided to the encoder 904. The encoder 904 analyzes the anticipated data transitions based on the data patterns stored in the first buffer 902 and then generates therefrom four bytes of modified data (where appropriate) as well as an additional byte of information (908) that describes the manner in which the data was modified (including whether the data was modified). These five bytes of data are at least temporarily stored in the second buffer 906, in the exemplary embodiment shown in FIG. 9, for subsequent transmission to the destination device (e.g., 804 in FIG. 8). Although four data bytes and one encode/decode byte are shown in FIG. 9, it is to be appreciated that embodiments of the invention are not limited to any specific number of data bytes, encode/decode bytes, ratio of data bytes to encode/decode bytes, and/or frequency of the encode/decode bytes used. As previously stated, various factors will affect the arrangement of data bytes and encode/decode bytes used, including, but not limited to, the type of algorithm used to modify the system data, the desired encoding/decoding complexity, available system resources and overhead, etc., as will become apparent to those skilled in the art.

Figure 10:
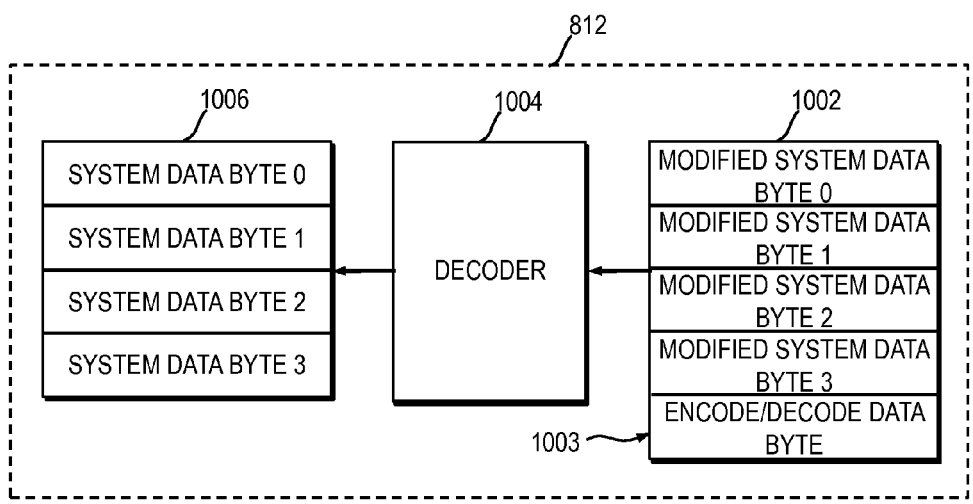
FIG. 10 is a block diagram depicting an exemplary data flow between system logic and interface circuitry shown in FIG. 8 during a read operation, according to an embodiment of the invention.

FIG. 10 is a block diagram depicting an exemplary data flow between the system logic 808 and the interface circuitry 810 shown in FIG. 8 during a read operation, according to an embodiment of the invention. With reference to FIG. 10, a portion of the encoder/decoder 812 used during the read operation is shown. Specifically, the encoder/decoder 812, in one or more embodiments, includes a first buffer 1002 configured to at least temporarily store modified data (modified system data byte 0, modified system data byte 1, modified system data byte 2, modified system data byte 3) and encode/decode information (encode/decode data byte 1003) used for decoding the data received from the destination device (804 in FIG. 8), a decoder 1004 coupled with the first buffer and configured to generate (i.e., decode) the original system data from the corresponding modified data, and a second buffer 1006 coupled with the decoder and configured to at least temporarily store the decoded system data (system data byte 0, system data byte 1, system data byte 2, system data byte 3) corresponding to the modified data stored in the first buffer. The system data stored in the second buffer 1006 is then used by the system logic (e.g., 808 in FIG. 8).

More particularly, during the read operation, modified system data bytes and a corresponding encode/decode data byte 1003 are received from the destination device and at least temporarily stored in the first buffer 1002. The decoder 1004 waits until the encode/decode byte 1003 is received and is then operative to generate the original four system data bytes from the modified system data bytes as a function of the encode/decode data byte 1003. Consistent with the encode/decode data byte 908 described in conjunction with FIG. 9, the encode/decode data byte 1003 provides information regarding how the data bytes read from the destination device were modified, including if a given byte was modified, for reducing SSO and/or coupling noise. The decoder 1004 is configured to use this information provided by the encode/decode data byte 1003 in decoding the modified system data to generate the corresponding original system data bytes. The original four system data bytes are then provided to the system logic as needed via the second buffer 1006. It is to be reiterated that various factors will affect the encoding/decoding scheme employed, including, but not limited to, the type of algorithm used to modify the original system data, the desired encoding/decoding complexity, available system resources and overhead, etc., as will become apparent to those skilled in the art.

Figure 11A:
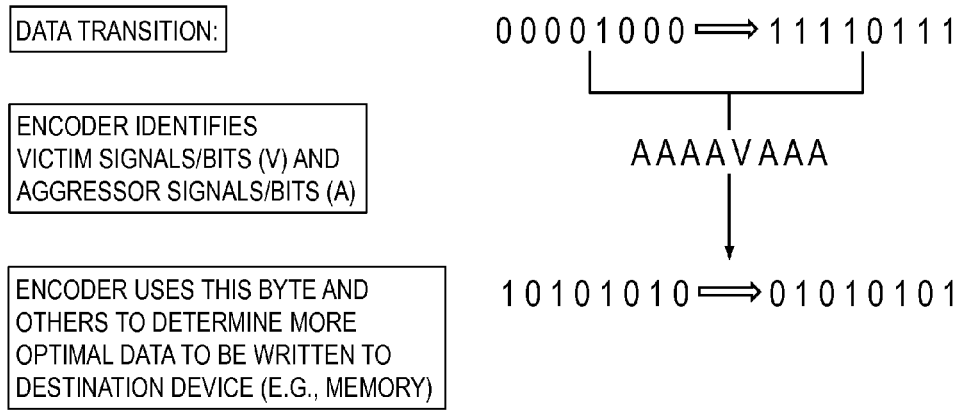
FIGS. 11A and 11B conceptually demonstrate two types of exemplary data transitions and a manner in which the data is modified for enhancing signal integrity in an interface system, according to an embodiment of the invention.
Figure 11B:
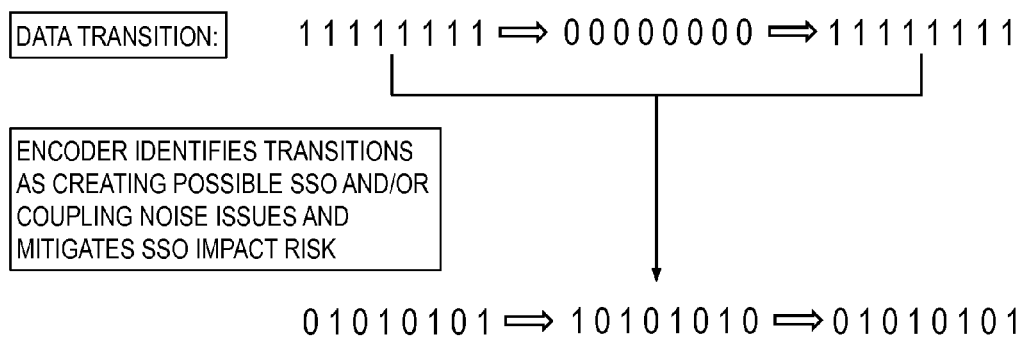

By way of illustration only and without loss of generality, FIGS. 11A and 11B conceptually demonstrate two types of exemplary data transitions and a manner in which the data is modified for enhancing signal integrity in an interface system, according to an embodiment of the invention. With reference to FIG. 11A, a victim/aggressor case is depicted in which a significant amount of SSO and/or other coupling noise may be produced. Specifically, FIG. 11A shows an illustrative transition from a first data pattern, 00001000, to a second data pattern, 11110111. In this case, bit 4 (from the right) is identified as a victim (V) signal and the other bits (bits 1-3 and 5-8) are identified as aggressor (A) signals. The aggressor signals cause disturbances on the victim signal, similar to the illustrative scenario previously described and shown in conjunction with FIG. 2. The encoder (e.g., encoder 812 in FIG. 8 or 904 in FIG. 9) is configured to identify the victim signal(s) and the aggressor signal(s), and to generate a modified data transition/pattern that beneficially reduces the amount of coupling noise. In this extreme example, a balanced 10101010 data pattern is desired (as this pattern results in minimal modification of data compared to, for instance a 01010101 data pattern), which will reduce the amount of coupling noise (e.g., SSO noise) seen across all signals. In order to achieve this data pattern, bits 8, 6 and 2 are inverted. Other data patterns may also be generated which similarly reduce coupling noise, taking into account factors such as, but not limited to, location on the die, package, and/or PCB, among other considerations.

With reference now to FIG. 11B, two illustrative transitions from a first data pattern, 00000000, to a second data pattern, 11111111, and from the second data pattern back to the first data pattern are shown. Although there are no identified victim signals in this scenario, each of the data transitions will cause a large amount of SSO noise, particularly on the power and ground connections (e.g., in the form of power bounce, caused by the first data transition, and ground bounce, caused by the second data transition). The encoder, in accordance with one or more embodiments, identifies this as being a potential issue and modifies the data patterns accordingly such that SSO noise is reduced. This extreme example changes the transitions to alternating 1's and 0's (by inverting bits 8, 6, 4 and 2), which reduces the stress on the power supplies, and thereby reduces SSO or other coupling noise on the bus.

It is to be understood that it is not always feasible, or even desirable, for all bytes of data to be modified into patterns of alternating 1's and 0's in all cases. Consequently, the encoder/decoder (e.g., 812 in FIG. 8) is configured to generate modified data patterns that reduce SSO, or other coupling noise, without having too large of an impact on system resources (e.g., number of bytes transferred, latency added to the system, etc.). Hence, an algorithm implemented by the encoder/decoder, according to one or more embodiments of the invention, is configured to modify data transitions as a function of a prescribed tradeoff between reducing the coupling noise and minimizing an impact on system resources.

As will be appreciated by those skilled in the art, at least a portion of embodiments of the present invention may be implemented as an apparatus, system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to as a "circuit," "module" or "system." Furthermore, embodiments of the present invention may take the form of a computer program product embodied in one or more non-transitory machine-readable medium(s) having machine-readable program code embodied thereon.

One or more embodiments of the invention, or elements thereof, can be implemented in the form of an apparatus including a memory and at least one processor coupled with the memory and operative to perform exemplary method steps.

Figure 12:
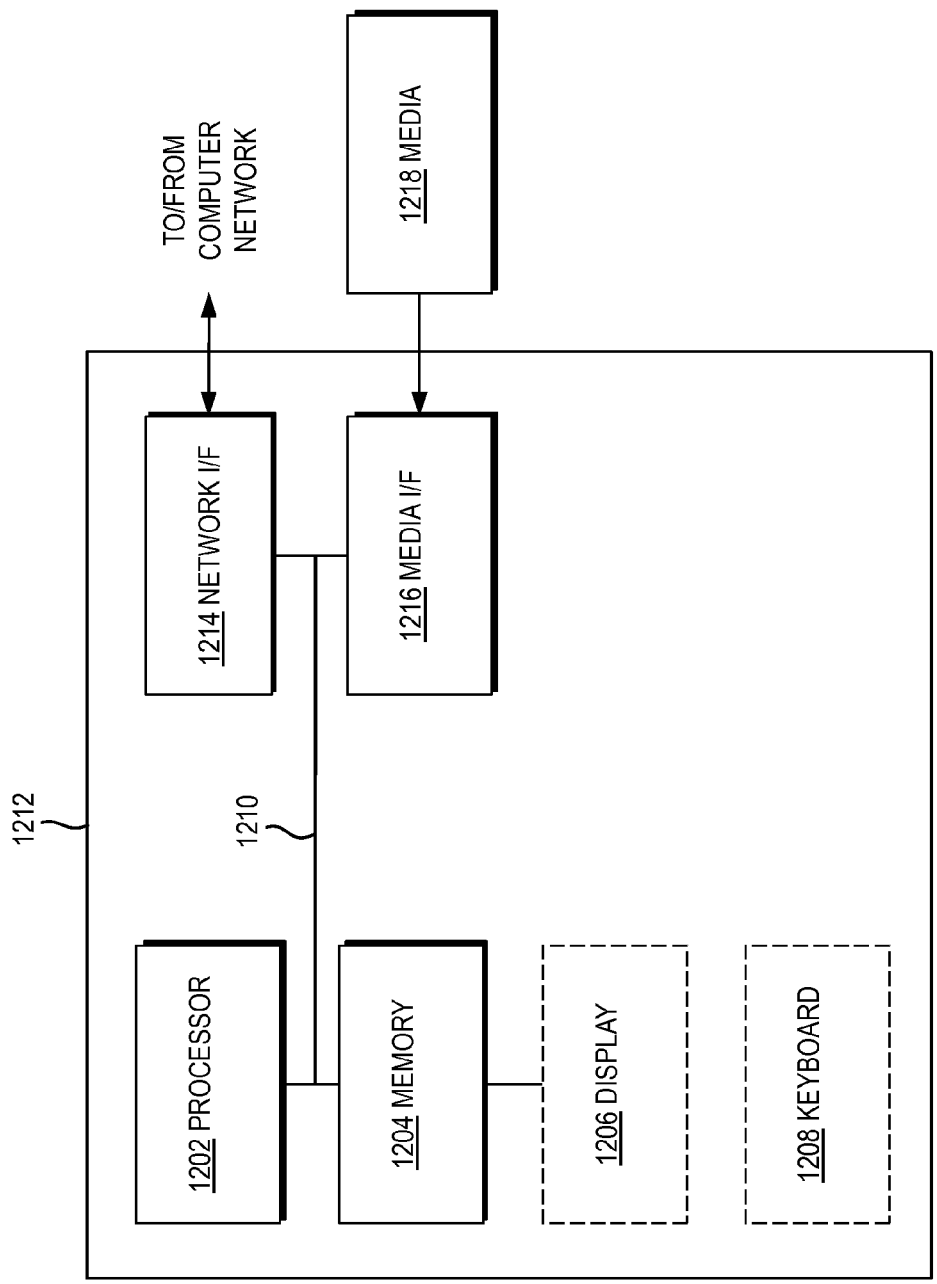
FIG. 12 depicts a computer system that may be useful in implementing at least a portion of one or more embodiments and/or elements of the invention.

One or more embodiments of the invention make use of software running on a general purpose computer or workstation which, when configured by the software, becomes a special purpose machine operative to perform methods in accordance with embodiments described herein. With reference to FIG. 12, such an implementation might employ, for example, a processor 1202, a memory 1204, and an input/output interface formed, for example, by a display 1206 and a keyboard 1208. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1202, memory 1204, and input/output interface such as display 1206 and keyboard 1208 can be interconnected, for example, via bus 1210 as part of a data processing unit 1212. Suitable interconnections, for example via bus 1210, can also be provided to a network interface 1214, such as a network card, which can be provided to interface with a computer network, and to a media interface 1216, such as a diskette or CD-ROM drive, which can be provided to interface with media 1218.

Accordingly, computer software including instructions or code for performing methodologies according to embodiments of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1202 coupled directly or indirectly with memory elements 1204 through a system bus 1210. The memory elements can include local memory employed during actual implementation of the program code, bulk storage, cache memories and embedded memory which provide temporary storage of at least a portion of program code in order to reduce the number of times the code must be retrieved from bulk storage during implementation.

Input/output or I/O devices (including but not limited to keyboards 1208, displays 1206, pointing devices, and the like) can be coupled to the system either directly (such as via bus 1210) or through intervening I/O controllers (omitted for clarity).

Network adapters such as network interface 1214 are also coupled with the system, in one or more embodiments of the invention, to enable the data processing system to become coupled with other data processing systems or remote printers or storage devices through intervening private or public networks. Modems, cable modem and Ethernet cards are just a few of the currently available types of network adapters.

As noted, one or more embodiments of the present invention may take the form of a computer program product embodied in one or more non-transitory machine- or computer-readable medium(s) having computer-readable program code embodied thereon. Any combination of one or more computer-readable medium(s) may be utilized. The computer-readable medium may be a computer readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. Media block 1218 is a non-limiting example. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In one or more embodiments, a computer-readable storage medium is any tangible medium that can contain or store a program, in a non-transitory manner, for use by or in connection with an instruction execution system, apparatus, or device.

Computer program code for carrying out operations according to one or more embodiments of the invention are written in any combination of one or more programming languages, including an object-oriented programming language such as Java, Smalltalk, C++ or the like and conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program code, in one or more embodiments, is loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing functions/acts specified in the block diagram modules or blocks.

The block diagrams in the figures depict illustrative architectures, functionality, and operation of implementations of systems, methods and computer program products according to embodiments of the present invention. In this regard, each block shown in the block diagrams, according to one or more embodiments, represents a module, segment, or portion of code, which comprises one or more executable instructions for implementing specified functions. It should also be noted that, in one or more embodiments, functions represented by the blocks may occur out of the order noted in the figures, to the extent that an order may be implied. For example, two blocks shown in succession may, in fact, be executed substantially concurrently, or the blocks may sometimes be executed in the reverse order, depending upon the functionality involved. It will also be appreciated that each module or block of the block diagrams, and combinations of blocks in the block diagrams, can be implemented by special purpose hardware-based systems that perform the specified functions or acts, or combinations of special purpose hardware and computer instructions.

It should be understood that any of the methods described herein can include an additional step of providing a system comprising distinct software modules embodied on a non-transitory computer-readable storage medium; the modules include, in one or more embodiments, any or all of the elements depicted in the block diagrams and/or described herein; by way of example and not limitation, an encoder/decoder module. The method steps can then be carried out using the distinct software modules and/or sub-modules of the system, executing on one or more hardware processors 1202. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, ASICs, functional circuitry, one or more appropriately programmed general purpose digital computers with associated memory, and the like. Given the teachings of the invention provided herein, one of ordinary skill in the related art will be able to contemplate other implementations of the components of the invention.

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Figure 13:
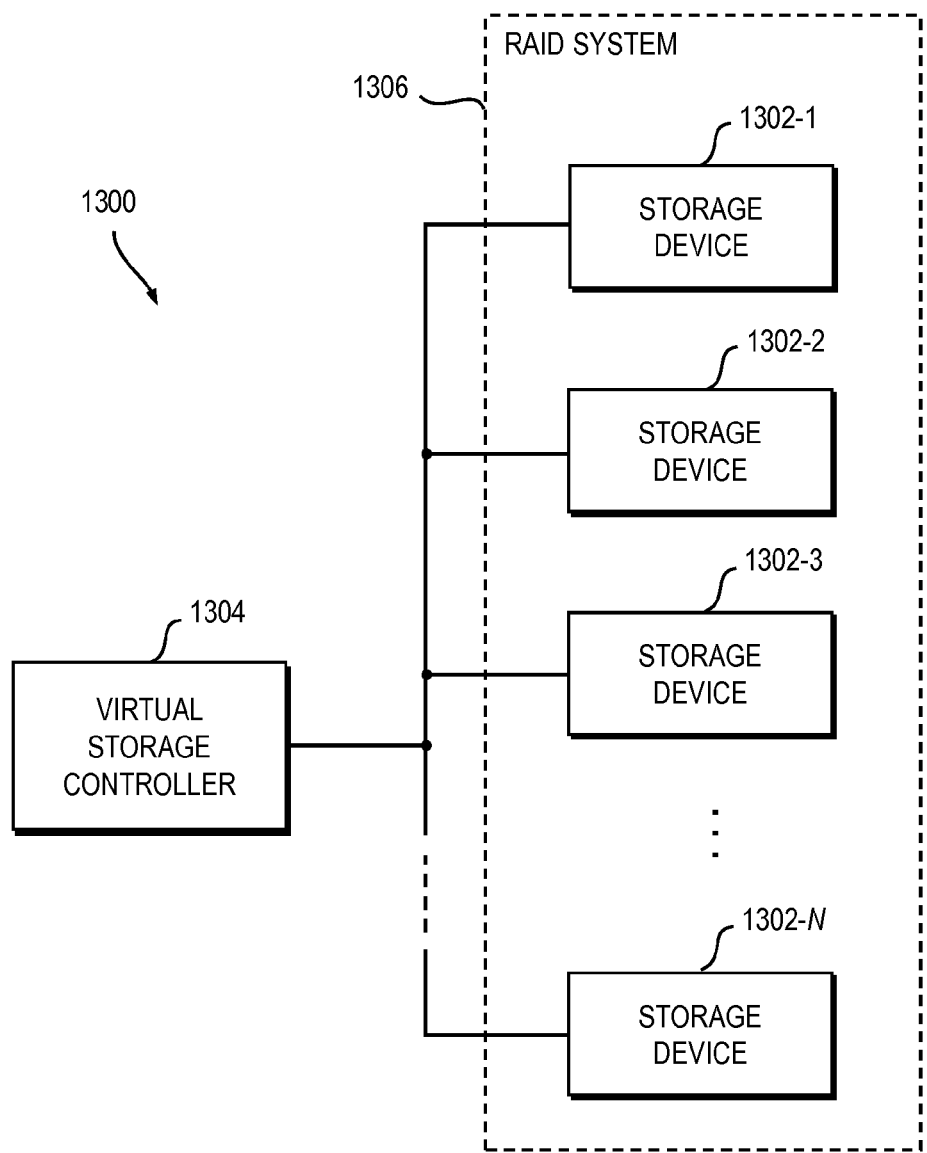
FIG. 13 is a block diagram depicting at least a portion of an exemplary virtual storage system comprising multiple storage devices, at least one of the storage devices incorporating techniques for reducing SSO effects and/or other coupling noise, according to an embodiment of the invention.

Embodiments of the invention are suitable for use in conjunction with a virtual storage system 1300 comprising multiple storage devices 1302-1 through 1302-N, possibly of multiple different types, as illustrated in FIG. 13. For example, the storage devices 1302-1 through 1302-N may be implemented using all hard disk drives (HDDs), all solid-state drives (SSDs), or using a combination of one or more HDDs and one or more SSDs. Other storage device types are similarly contemplated. The virtual storage system 1300, also referred to as a storage virtualization system, illustratively comprises a virtual storage controller 1304 coupled with a redundant array of independent devices (RAID) system 1306. As will be known by those skilled in the art, RAID is a storage technology that provides increased reliability, among other features, through redundancy. This is accomplished by combining multiple physical storage components (e.g., HDDs, SSDs, etc.) into a logical (i.e., virtual) unit, where data is distributed across the multiple storage components in one of a plurality of ways, generally referred to as "RAID levels." The RAID system 1306 more specifically comprises N distinct storage devices denoted 1302-1, 1302-2, . . . 1302-N, where N is an integer greater than one. As previously stated, all storage devices 1302-1 through 1302-N need not be of the same type. Furthermore, one or more of the storage devices 1302-1 through 1302-N of the RAID system 1306 are assumed to be configured to include apparatus and/or circuitry as disclosed herein. These and other virtual storage systems comprising multiple storage devices (e.g., HDDs, SSDs, or some combination of HDDs and SSDs), are considered embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Written Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Written Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method for enhancing signal integrity in an interface between a source device and at least one destination device, the method comprising:
   analyzing two or more consecutive data patterns intended to be conveyed by the interface to determine whether data transitions corresponding to the data patterns are likely to introduce at least one of coupling noise and simultaneous switching output (SSO) effects on the interface;
   generating a modified data pattern for transmission by the interface, the modified data pattern reducing at least one of coupling noise and SSO effects on the interface compared to an original data pattern intended to be conveyed by the interface; and
   transmitting the modified data pattern and information regarding a manner in which the original data pattern was modified to the at least one destination device to thereby reduce at least one of coupling noise and SSO effects on the interface.

2. The method of claim 1, wherein analyzing two or more consecutive data patterns comprises:
   storing a first data pattern;
   comparing the first data pattern with a second data pattern that is temporarily adjacent to the first data pattern; and
   determining, as a function of the comparison between the first and second data patterns, which bit positions in the second data pattern result in a change of logical state.

3. The method of claim 2, wherein analyzing two or more consecutive data patterns comprises designating, as a function of the comparison between the first and second data patterns, at least one bit position in the second data pattern as a victim signal and designating at least one bit position in the second data pattern as an aggressor signal.

4. The method of claim 2, wherein generating the modified data pattern comprises inverting a logical state of at least one bit position in the second data pattern.

5. The method of claim 1, wherein generating the modified data pattern comprises encoding the original data pattern by inverting a logical state of at least one bit position in the original data pattern, wherein the information regarding the manner in which the original data pattern was modified comprises an indication of the at least one bit position in the original data pattern that is inverted.

6. The method of claim 1, wherein generating the modified data pattern comprises performing data compression of the modified data pattern and the information regarding the manner in which the original data pattern was modified.

7. The method of claim 1, wherein generating the modified data pattern comprises increasing a bit width of the interface such that each cycle of modified data pattern carries with it the information regarding the manner in which the original data pattern was modified.

8. The method of claim 1, wherein the information regarding the manner in which the original data pattern was modified comprises data regarding a methodology to be used in decoding the modified data pattern.

9. The method of claim 8, wherein the data regarding the methodology to be used in decoding the modified data pattern is embedded with bits of the modified data pattern.

10. The method of claim 1, further comprising storing the information regarding the manner in which the original data pattern was modified in a storage element, and wherein transmitting the modified data pattern comprises retrieving the information regarding the manner in which the original data pattern was modified from the storage element and transmitting the information with the modified data pattern to the at least one destination device.

11. An apparatus for enhancing signal integrity in an interface with at least one destination device, the apparatus comprising:
   interface circuitry in operative communication with the at least one destination device via the interface; and
   an encoder/decoder coupled with the interface circuitry, the encoder/decoder being configured: to analyze two or more consecutive data patterns intended to be conveyed by the interface to determine whether data transitions corresponding thereto are likely to introduce at least one of coupling noise and simultaneous switching output (SSO) effects on the interface; to generate a modified data pattern for transmission by the interface, the modified data pattern reducing at least one of coupling noise and SSO effects on the interface compared to an original data pattern intended to be conveyed by the interface; and to transmit the modified data pattern and information regarding a manner in which the original data pattern was modified to the at least one destination device to thereby reduce at least one of coupling noise and SSO effects on the interface.

12. The apparatus of claim 11, wherein the interface circuitry comprises a plurality of bidirectional buffers, each of the bidirectional buffers corresponding to a bit of an input/output bus forming at least a portion of the interface.

13. The apparatus of claim 11, further comprising at least a first buffer coupled with the encoder/decoder, the first buffer being configured to at least temporarily store the original data pattern intended to be conveyed by the interface.

14. The apparatus of claim 13, further comprising a second buffer coupled with the encoder/decoder and the interface circuitry, the second buffer being configured to at least temporarily store the modified data pattern for transmission to the at least one destination device.

15. The apparatus of claim 11, further comprising a storage element configured to at least temporarily store the information regarding the manner in which the original data pattern was modified for transmission, with the modified data pattern, to the at least one destination device.

16. The apparatus of claim 11, wherein the encoder/decoder is configured to generate the modified data pattern by encoding the original data pattern by inverting a logical state of at least one bit position in the original data pattern, wherein the information regarding the manner in which the original data pattern was modified comprises an indication of the at least one bit position in the original data pattern that is inverted.

17. The apparatus of claim 11, wherein the encoder/decoder, in analyzing the two or more consecutive data patterns, is configured: to store a first data pattern; to compare the first data pattern with a second data pattern that is temporarily adjacent to the first data pattern; and to determine, as a function of the comparison between the first and second data patterns, which bit positions in the second data pattern result in a change of logical state.

18. The apparatus of claim 17, wherein the encoder/decoder, in analyzing the two or more consecutive data patterns, is configured to designate, as a function of the comparison between the first and second data patterns, at least one bit position in the second data pattern as a victim signal and to designate at least one bit position in the second data pattern as an aggressor signal.

19. The apparatus of claim 11, wherein the encoder/decoder is configured to generate the modified data pattern by performing data compression of the modified data pattern and the information regarding the manner in which the original data pattern was modified.

20. The apparatus of claim 11, wherein at least a portion of the apparatus is fabricated in an integrated circuit.

21. An electronic system, comprising:
at least one apparatus for enhancing signal integrity in an interface with at least one destination device, the at least one apparatus comprising:
interface circuitry in operative communication with the at least one destination device via the interface; and
an encoder/decoder coupled with the interface circuitry, the encoder/decoder being configured: to analyze two or more consecutive data patterns intended to be conveyed by the interface to determine whether data transitions corresponding thereto are likely to introduce at least one of coupling noise and simultaneous switching output (SSO) effects on the interface; to generate a modified data pattern for transmission by the interface, the modified data pattern reducing at least one of coupling noise and SSO effects on the interface compared to an original data pattern intended to be conveyed by the interface; and to transmit the modified data pattern and information regarding a manner in which the original data pattern was modified to the at least one destination device to thereby reduce at least one of coupling noise and SSO effects on the interface.

* * * * *